SEMICONDUCTOR CIRCUIT ASSEMBLY

Filed Aug. 8, 1967 2 Sheets-Sheet 1

Inventor:
Hans-Helmut Feldmann
By: Spencer & Kaye
Attorneys

Inventor:
Hans-Helmut Feldmann
By: Spencer & Kaye
Attorneys

United States Patent Office 3,480,837

Patented Nov. 25, 1969

3,480,837

SEMICONDUCTOR CIRCUIT ASSEMBLY

Hans-Helmut Feldmann, Neu-Isenburg, Germany, assignor to Licentia Patent-Verwaltungs G.m.b.H., Frankfurt am Main, Germany Filed Aug. 8, 1967, Ser. No. 659,070

Int. Cl. H02b *1/02, 1/04, 9/00*

U.S. Cl. 317—100 17 Claims

ABSTRACT OF THE DISCLOSURE

A semiconductor circuit assembly in which a heat-conductive material is positioned between a plurality of semiconductor devices and a plurality of load resistors therefor to simultaneously cool the semiconductor devices and their load resistors. The resistors are formed by relatively thin layers of conductive material on an electrical insulator element which is attached to the side of the heat-conductive material opposite the semiconductor devices. The conductors for connecting the semiconductor devices to the resistors may pass through bores in the heat-conductive material and in the insulator element. In one embodiment, the heat-conductive material includes a plurality of heat-conductive plates which are joined together in their centers and bent at their edges to form a plurality of spaced, substantially parallel radiator fins.

Background of the invention

The present invention relates to a circuit assembly in which a plurality of parallel-connected semiconductor devices, particularly controlled semiconductor devices, such as transistors or the like, are mounted on a heat-conductive cooling element. In this type of circuit, so-called compensating resistors, which have an inverse feedback effect, are usually connected in series with the output of such semiconductor devices in order to balance the load. It is furthermore necessary in many cases to provide common resistors to all of the parallel-connected semiconductor devices from which a voltage corresponding to the total current is tapped to control, for example, a current limiter circuit or which forms a shunt for a current-measuring instrument.

The compensating resistors as well as the resistors common to all parallel-connected semiconductor devices are traversed by the current flowing through the semiconductor devices. The dissipation of heat created in the resistors due to $I^2R$ losses creates a problem which can be controlled only with difficulty even when the resistors are disposed directly in the air stream of a ventilator. Thus, these prior art circuits present a problem in that their resistors must have relatively large dimensions in order to handle the relatively high levels of heat involved.

It is the object of the present invention to provide a semiconductor circuit assembly having parallel-connected semiconductor elements mounted on a heat-conductive cooling element and in which the compensating resistors and other resistors coupled to the semiconductor devices form a structural unit with the cooling element wherein the resistors can be positioned in the flow of a coolant in such a manner as to provide the best possible dissipation of heat without interfering with the flow of coolant.

Summary of the invention

In accordance with this invention, the above-noted problem is solved by forming the resistors as conductive paths in a planar resistance layer which is deposited on a plate of insulating material and by mounting the insulating material with its surface adjacent to the heat-conductive cooling element.

If the electrical insulating material also has good heat-conducting properties, a good heat transfer to the cooling element is effected, and thus a high current load is possible. The planar resistors can furthermore dissipate relatively large amounts of heat through their surface away from the cooling element, especially when a coolant stream, e.g., cooling air, is directed parallel thereto. Moreover, the flow of cooling air is not obstructed by the resistors as was true in the prior art.

The above-noted planar resistors can be produced advantageously either chemically or mechanically, e.g., in the form of a printed circuit, out of a solid layer of resistance material by cutting or etching away portions of the resistance material according to well known prior art techniques.

The resistance material preferably consists of a material whose resistance is temperature-independent, such as, for example, Constantan, if the compensating resistors and the resistors common to all parallel-connected semiconductor devices are not to change with temperature. Since semiconductor devices, particularly transistors, however, become more sensitive to overloads with increasing temperatures, it can be advantageous under certain circumstances to use a material for the resistors which has a positive temperature coefficient of resistance so that the current through the semiconductor devices is reduced with increasing temperature. If the common resistor, which, e.g., serves as current limiter, also has a positive temperature coefficient of resistance, the current limitation will be initiated earlier because of the greater voltage drop occurring at high temperatures, which under certain circumstances might also be desirable.

It is advantageous to simultaneously interconnect the semiconductor devices by means of the printed circuit containing the resistors. If the semiconductor devices and the printed circuit are disposed on different sides of the cooling element, the connecting leads of the semiconductors can be brought uninsulated through bores in the cooling element plates and the insulating material to the compensating resistors disposed on the other side thereof and representing another portion of the printed circuit and can be soldered thereto.

With the arrangement of resistors according to the present invention in a printed circuit, fusible conductors can be connected into the main current circuits of the semiconductor devices without additional expense, the fuse conductors being connected with the printed circuit at two soldering points for selective fusing. In this arrangement it can be determined at once, due to the melting of the fuse conductor, which semiconductor device is defective.

The printed circuit does not have to consist only of the above-noted resistors, but may also contain other types of resistors, for example, shunts for measuring purposes consisting of flat metal strip loops which are soldered to the conductive material.

If the cooling element is provided with cooling fins, the fins are preferably mounted in such a manner that they form a angle with the semiconductor devices and with the cooling element surfaces carrying the resistors. Two or more semiconductor circuit assemblies can then be so arranged that the cooling fins, together with the cooling element plates, form at least approximately closed channels. Aside from being a compact structure, this arrangement has the further advantage that one ventilator can blow over two or more cooling elements without the need for special piping and with the same very good cooling effect.

To control the temperature of the heat-conductive cooling element, which generally consists of a metal such as copper which has good heat-conductivity, a thermostat can be disposed directly thereon so as to activate the flow of cooling air when cooling is insufficient due to insufficient ventilation or too high an ambient temperature. If the cooling element consists of a material such as copper which is also electrically conductive, it can be utilized as the current supply lead for the parallel connected semiconductor devices.

The semiconductor circuit assembly according to the present invention has numerous advantages: The compensating resistors as well as the resistors common to all of the semiconductor devices take full advantage of the cooling power of the cooling element while requiring a minimum amount of space. Furthermore, their free surfaces can easily be placed into the coolant stream without impeding the flow of coolant. If the resistors are constructed in the form of conductive paths on a printed circuit board, printed circuit paths can additionally serve to provide circuit connections. According to a special embodiment of the present invention, it is possible without any additional expenditures to provide fusible conductors in the printed circuit for the purpose of selective fusing, whose melting is easily discernible optically. Finally, the cooling fins of pairs of cooling elements, extending from one surface of a cooling element plate containing the semiconductor devices, form channels for guiding the cooling air in addition to providing the required cooling.

Description of the preferred embodiments

Figure 1:
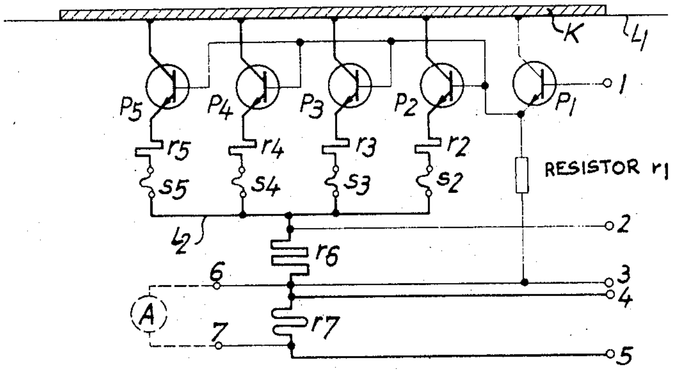
FIGURE 1 is a schematic circuit diagram of one illustrative semiconductor circuit assembly of this invention.

In FIGURE 1, the parallel-connected transistors $P_2$, $P_3$, $P_4$ and $P_5$, which form a single control element, and which are controlled by a common transistor $P_1$, are connected together with compensating resistors $r_2$, $r_3$, $r_4$ and $r_5$, disposed in their respective emitter circuits, to the common input lines $L_1$ and $L_2$. Transistors $P_1 \ldots P_5$ are mounted on the schematically indicated cooling element K, which in this embodiment serves as the collector lead for the transistors. The resistors $r_6$ and $r_7$ are connected in series with all of the transistors $P_2 \ldots P_5$ and carry their total load current. Resistor $r_6$ can serve, for example, to generate a proportional voltage between terminals 2 and 3 to control a current limiter circuit, which is not shown in the drawings, whereas resistor $r_7$ represents a shunt for a current-measuring instrument A connected between terminals 6 and 7.

The compensation resistors $r_2 \ldots r_5$ serve to create a voltage change in the emitter circuit of their respective transistor when the load current of the transistor varies from the load current of the remaining transistors, which voltage change tends to counteract the current unbalance that caused it. Since the resistors $r_2 \ldots r_5$ conduct the load current of transistors $P_2 \ldots P_5$, it is difficult to cool them because of the relatively large amounts of heat to be dissipated. This is also true for resistor $r_6$ and possibly for resistor $r_7$ also, depending on its resistance.

Figure 3:
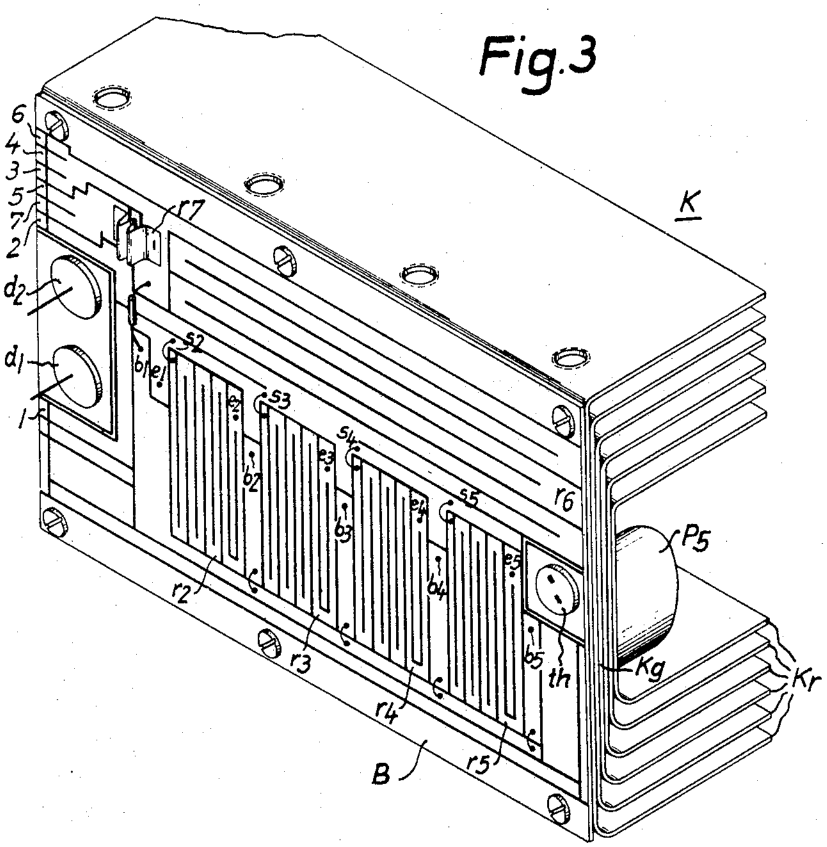
FIGURE 3 is a perspective view of the embodiment illustrated in FIGURES 2*a* and 2*b*.
Figure 2A:
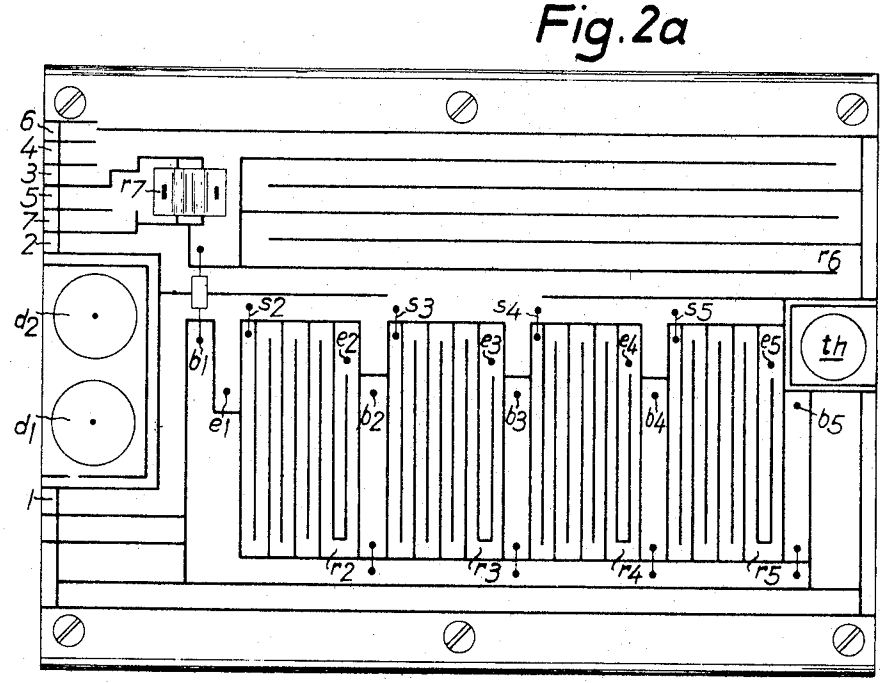
FIGURE 2*a* is a plan view of one illustrative semiconductor circuit assembly of this invention.
Figure 2B:
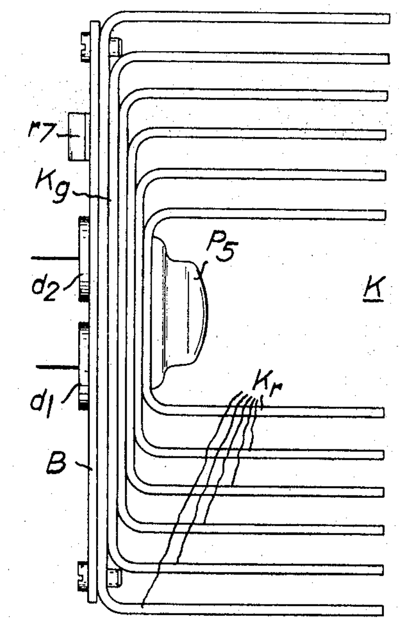
FIGURE 2*b* is a side view of the embodiment illustrated in FIGURE 2*a*.

FIGURES 2*a*, 2*b* and 3 show the mechanical structure of one illustrative embodiment of the invention. The cooling element K of this embodiment contains cooling fins $K_r$ and a base plate $K_g$, which latter is formed by the rectangularly bent and soldered-together backs of the cooling fins $K_r$. One side of the base plate $K_g$ contains transistors $P_1 \ldots P_5$, of which only one transistor, $P_5$, is shown in the drawings. The insulated underside of a printed circuit board B directly abuts against the other side of base plate $K_g$ of the cooling element K. The circuit board B contains compensating resistors $r_2 \ldots r_5$ and the resistor $r_6$ in the form of flat meandering conductive paths of a printed circuit. Such conductive paths can be formed in accordance with the well known prior art techniques of etching or cutting. If the resistance material has a positive temperature coefficient, the resistance values increase with increasing cooling element temperature, and hence transistor temperature, whereby the voltage drop becomes larger and thus the emitter current decreases. This behavior is very desirable, since transistors become more sensitive to over-loads with increasing temperature. An increase in the resistance or $r_6$ with increasing temperature will have similar results, since in this case the current limitation is initiated earlier because of the greater voltage drop available for the actuation of a limiter circuit.

In FIGURES 2*a* and 3, the soldering points of the base connections of transistors $P_1 \ldots P_5$ are marked $b_1 \ldots b_5$, and the soldering points of the emitters are marked $e_1 \ldots e_5$.

The connection between the compensating resistors $r_2 \ldots r_5$ and the common resistors $r_6$ is accomplished via small wire loops $s_2 \ldots s_5$, serving as fusible conductors, which are fastened at the respective soldering points indicated by dots in FIGURES 2*a* and 3. If a transistor should become short circuited and cause its fusible conductor to melt, the location of the defective transistor can immediately be recognized by the interruption in the fusible conductor.

The shunt $r_7$, which is in the form of a flat metal loop, is also disposed on the printed circuit board B.

The printed circuit board B need not occupy the entire surface area of the cooling element K. Semiconductor devices can also be disposed on the side of the cooling element K opposite the side containing the transistors. This is illustrated in FIGURES 2*a* and 2*b* by the diodes $d_1$ and $d_2$ and the thermostat element th which are mounted on the opposite side of the cooling element K from the transistors $P_1 \ldots P_5$.

If two cooling elements are each disposed adjacent to each other in such a manner that their cooling fins oppose each other, these fins, together with their base plates, form channels through which the cooling air can flow. Thus only one ventilator is required for two semiconductor circuit assemblies according to the present invention when they are mounted with their cooling fins opposing each other.

The circuit assembly according to the present invention is not limited for use with transistors as semiconductor devices; it can also be provided with thyristors, diodes, or other suitable semiconductor elements.

It will be understood that the above description of the present invention is susceptible to various modifications, changes, and adaptations, and the same are intended to be comprehended within the meaning and range of equivalents of the appended claims.

I claim:

1. A semiconductor circuit assembly comprising, in combination:

(a) at least one semiconductor device;

(b) a heat-conductive element having two opposing surfaces, said semiconductor device being mounted on one surface of said heat-conductive element to be cooled thereby;

(c) an electrical insulator element having two opposite surfaces with a relatively thin layer of electrically conductive material on one surface thereof and forming a resistor element, said electrical insulator element being mounted with its other surface adjacent to said heat conductive element to be cooled thereby; and (d) means electrically coupling said resistor element to said semiconductor device.

2. A semiconductor circuit assembly as defined in claim 1 and further comprising a plurality of semiconductor devices mounted on said one surface of said heat-conductive element to be cooled thereby, a plurality of resistor elements formed on said one surface of said electrical insulator element, and means electrically coupling said resistor elements to said semiconductor devices to form a predetermined semiconductor circuit.

3. A semiconductor circuit assembly as defined in claim 2 wherein said semiconductor devices are coupled together in parallel with at least one of said resistor elements being coupled to all of said semiconductor devices.

4. A semiconductor circuit assembly as defined in claim 1 wherein said resistor element comprises a flat, meandering strip in said relatively thin layer of electrically conductive material.

5. A semiconductor circuit assembly as defined in claim 3 wherein at least the resistor element which is coupled to all of said semiconductor devices is made of a material whose resistivity is substantially independent of temperature.

6. A semiconductor circuit assembly as defined in claim 3 wherein at least the resistor element which is coupled to all of said semiconductor devices is made of a metallic resistance material having a positive temperature coefficient of resistivity.

7. A semiconductor circuit assembly as defined in claim 2 wherein said means electrically coupling said resistor elements to said semiconductor devices are connected to the relatively thin layers of electrically conductive material forming said resistor elements.

8. A semiconductor circuit assembly as defined in claim 2 wherein said heat-conductive element and said electrical insulator element are provided with bores for admitting non-insulated leads extending from said semiconductor elements to said resistor elements.

9. A semiconductor circuit assembly as defined in claim 2 wherein said means electrically coupling said resistor elements to said semiconductor devices includes at least one fusible conductor for opening the circuit of at least one of said semiconductor devices in response to current flow therethrough in excess of a predetermined level.

10. A semiconductor circuit assembly as defined in claim 3 and further comprising another resistor in the form of a flat metal loop which is coupled to all of said semiconductor devices.

11. A semiconductor circuit assembly as defined in claim 1 wherein said heat-conductive element contains a plurality of substantially parallel cooling fins projecting at an angle from the cooling surface thereof.

12. A semiconductor circuit assembly as defined in claim 1 and further comprising a thermostat element mounted on said heat-conductive element.

13. A semiconductor circuit assembly as defined in claim 1 wherein said heat-conductive material is also electrically conductive, and wherein said semiconductor devices are also electrically connected to said heat-conductive material, said heat-conducting material thereby acting as one conductor for said semiconductor devices.

14. A semiconductor circuit assembly as defined in claim 1 wherein said semiconductor devices comprise transistors.

15. A semiconductor circuit assembly as defined in claim 1 wherein said heat-conductive element and said electrical insulator element are relatively flat parallel sheets which are secured together, the surface of the insulator sheet opposite to that on which the electrically conductive material is mounted being connected to the surface of the heat conductive element opposite to that on which the semiconductor device is mounted.

16. A semiconductor circuit assembly as defined in claim 15 wherein said heat-conductive element is formed of a plurality of parallel sheets having their central portions secured together, the portions of each sheet on each side of the central portion being bent at approximately 90° to extend away from said insulated sheet and to form a series of spaced parallel cooling fins, said fins being on each side of said semiconductor device.

17. A semiconductor circuit assembly as defined in claim 16 wherein said semiconductor device is a power transistor.

References Cited

UNITED STATES PATENTS

| | | | |
|---|---|---|---|
| 2,758,256 | 8/1956 | Eisler. | |
| 3,212,569 | 10/1965 | McAdam | 317—100 XR |
| 3,236,296 | 2/1966 | Dubin | 317—100 XR |
| 3,317,797 | 5/1967 | Webb | 317—100 |
| 3,395,318 | 7/1968 | Laermer et al. | 317—100 |

ROBERT K. SCHAEFER, Primary Examiner

J. R. SCOTT, Assistant Examiner

U.S. Cl. X.R.

29—157.3; 165—80; 317—101